United States Patent
Fang et al.

(10) Patent No.: US 12,259,436 B2
(45) Date of Patent: Mar. 25, 2025

(54) BATTERY STATUS MONITORING AND BATTERY MANAGEMENT OF AN INFORMATION HANDLING SYSTEM

(71) Applicant: Dell Products L.P., Round Rock, TX (US)

(72) Inventors: Jui Chin Fang, Taipei (TW); Chien-Hao Chiu, Taoyuan (TW); Wen-Yung Chang, Taoyuan (TW); Pei-Ying Lin, New Taipei (TW)

(73) Assignee: Dell Products L.P., Round Rock, TX (US)

( * ) Notice: Subject to any disclaimer, the term of this patent is extended or adjusted under 35 U.S.C. 154(b) by 145 days.

(21) Appl. No.: 18/192,342

(22) Filed: Mar. 29, 2023

(65) Prior Publication Data

US 2024/0329139 A1 Oct. 3, 2024

(51) Int. Cl.
*G01R 31/367* (2019.01)
*G01R 31/388* (2019.01)
*G01R 31/389* (2019.01)
*H02J 7/00* (2006.01)

(52) U.S. Cl.
CPC ......... *G01R 31/367* (2019.01); *G01R 31/388* (2019.01); *G01R 31/389* (2019.01); *H02J 7/00712* (2020.01)

(58) Field of Classification Search
None
See application file for complete search history.

(56) References Cited

U.S. PATENT DOCUMENTS

| 2013/0325379 A1* | 12/2013 | Nakamura | G01R 31/3835 702/63 |
| 2015/0301121 A1* | 10/2015 | Park | G01R 31/392 324/426 |
| 2016/0064980 A1* | 3/2016 | Jung | G01R 31/44 320/162 |
| 2017/0052230 A1* | 2/2017 | Syouda | B60L 58/10 |

\* cited by examiner

Primary Examiner — Jas A Sanghera
(74) Attorney, Agent, or Firm — McDermott Will & Emery LLP

(57) ABSTRACT

Managing a battery including measuring, in response to a first charging current and over a first time period, a first amperage and a first voltage of the cell at predetermined intervals; measuring, in response to a second charging current and over a second time period, a second amperage and a second voltage of the cell at the predetermined intervals; determining that the first amperage of the cell was maintained greater than a first threshold amount of time within the first time period, and in response, qualifying the first amperage and the first voltage as stable; determining that the second amperage of the cell was maintained greater than a second threshold amount of time within the second time period, and in response, qualifying the second amperage and the second voltage as stable; and in response to the qualifying, calculating a DCIR of the cell based on the voltages and the amperage.

17 Claims, 4 Drawing Sheets

BATTERY STATUS MONITORING AND BATTERY MANAGEMENT OF AN INFORMATION HANDLING SYSTEM

BACKGROUND

Field of the Disclosure

The disclosure relates generally to an information handling system, and in particular, battery status monitoring and battery management of an information handling system.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Lithium-ion cells are an integral part of a battery of many portable computing products, such as information handling systems. However, low performance of a lifespan of the battery can lead to dissatisfaction of the information handling system by consumers. High operating and storage voltage of the battery can lead to inactive lithium, and thus reduce the amount of lithium used for charge/discharge of the battery and reduced energy/capacity of the battery.

SUMMARY

Innovative aspects of the subject matter described in this specification may be embodied in a method of managing a battery at an information handling system, including charging, over a first time period, the battery with a first charging current; charging, over a second time period after the first time period, the battery with a second charging current less than the first charging current; for each cell of the battery: measuring, in response to the first charging current and over the first time period, a first amperage and a first voltage of the cell at predetermined intervals; measuring, in response to the second charging current and over the second time period, a second amperage and a second voltage of the cell at the predetermined intervals; storing, at a look-up table (LUT) at a storage device, data indicating the first and the second amperages and the first and the second voltages of the cell at each of the predetermined intervals; determining, based on the stored data, that the first amperage of the cell was maintained greater than a first threshold amount of time within the first time period, and in response, qualifying the first amperage and the first voltage as stable for the first time period; determining, based on the stored data, that the second amperage of the cell was maintained greater than a second threshold amount of time within the second time period, and in response, qualifying the second amperage and the second voltage as stable for the second time period; and in response to qualifying the first amperage and the first voltage for the first time period and qualifying the second amperage and the second voltage for the second time period, calculating a direct circuit internal resistance (DCIR) of the cell based on a ratio of i) a first difference between first voltage and the second voltage and ii) a second difference between the first amperage and the second amperage.

Other embodiments of these aspects include corresponding systems, apparatus, and computer programs, configured to perform the actions of the methods, encoded on computer storage devices.

These and other embodiments may each optionally include one or more of the following features. For instance, comparing the DCIR to a threshold; determining, based on comparing, that the DCIR is greater than the threshold; and in response to determining that the DCIR is greater than the threshold, adjusting a charge policy associated with charging of the battery. Adjusting the charge policy associated with charging of the battery includes adjusting a charge voltage associated with charging of the battery. Adjusting the charge voltage associated with charging of the battery includes reducing the charge voltage associated with charging of the battery. Determining, based on the stored data, that the first amperage of the cell was not maintained greater than the first threshold amount of time within the first time period, and in response, resetting the charging current of the battery to the first charging current and resetting the look-up table. Determining that, based on the stored data, that the second amperage of the cell was not maintained greater than the second threshold amount of time within the second time period, and in response, resetting the charging current of the battery to the first charging current and resetting the look-up table. Determining that one or more trigger parameters are satisfied, and in response, charging the battery with the first charging current. Determining, based on the stored data, that the first amperage of the cell is equal to or greater than a target threshold amperage, and in response, determining, based on the stored data, whether the first amperage of the cell was maintained equal to or greater than the target threshold amperage for greater than the first threshold amount of time within the first time period. Determining, based on the stored data, that the first amperage of the cell is less than a target threshold amperage, and in response, resetting the charging current of the battery to the first charging current and resetting the look-up table. Determining, based on the stored data, that the second amperage of the cell is equal to or greater than a target threshold amperage, and in response, determining, based on the stored data, whether the second amperage of the cell was maintained equal to or greater than the target threshold amperage for greater than the second threshold amount of time within the second time period. Determining, based on the stored data, that the first amperage of the cell is less than a target threshold amperage, and in response, resetting the charging current of the battery to the first charging current and resetting the look-up table.

The details of one or more embodiments of the subject matter described in this specification are set forth in the accompanying drawings and the description below. Other potential features, aspects, and advantages of the subject matter will become apparent from the description, the drawings, and the claims.

DESCRIPTION OF PARTICULAR EMBODIMENT(S)

Figure 1:
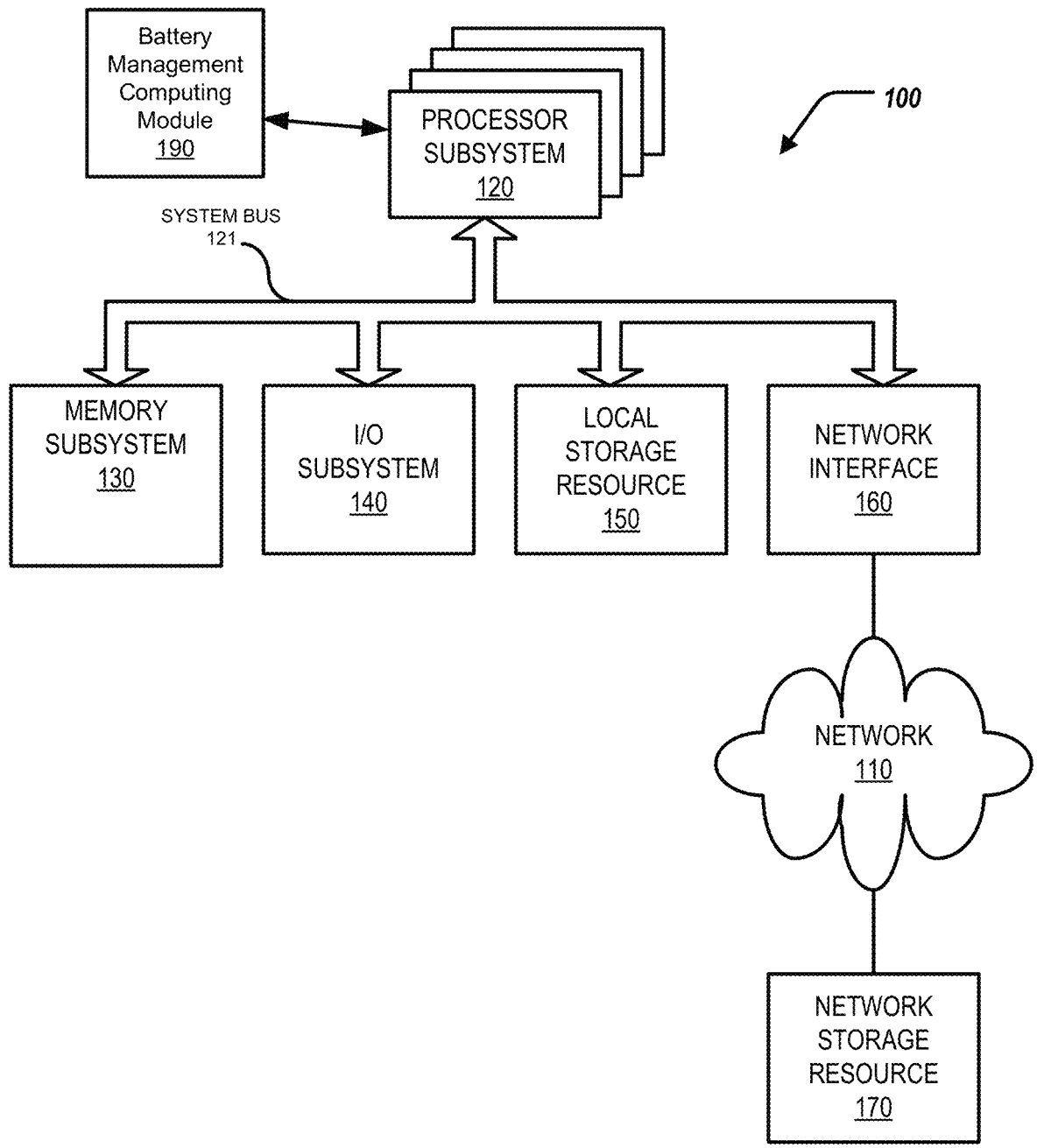
FIG. 1 is a block diagram of selected elements of an embodiment of an information handling system.

This disclosure discusses methods and systems for battery status monitoring and battery management of an information handling system. In short, direct current internal resistance (DCIR) measurements of a battery are performed for customization of a charge policy of the battery. Specifically, the DCIR of the battery can be correlated with a performance of the battery. Thus, by developing a battery DCIR diagnosis method and management of the charge policy according to the DCIR can minimize unexpected performance issues of the battery.

Specifically, this disclosure discusses a system and a method for managing a battery at an information handling system, including charging, over a first time period, the battery with a first charging current; charging, over a second time period after the first time period, the battery with a second charging current less than the first charging current; for each cell of the battery: measuring, in response to the first charging current and over the first time period, a first amperage and a first voltage of the cell at predetermined intervals; measuring, in response to the second charging current and over the second time period, a second amperage and a second voltage of the cell at the predetermined intervals; storing, at a look-up table (LUT) at a storage device, data indicating the first and the second amperages and the first and the second voltages of the cell at each of the predetermined intervals; determining, based on the stored data, that the first amperage of the cell was maintained greater than a first threshold amount of time within the first time period, and in response, qualifying the first amperage and the first voltage as stable for the first time period; determining, based on the stored data, that the second amperage of the cell was maintained greater than a second threshold amount of time within the second time period, and in response, qualifying the second amperage and the second voltage as stable for the second time period; and in response to qualifying the first amperage and the first voltage for the first time period and qualifying the second amperage and the second voltage for the second time period, calculating a direct circuit internal resistance (DCIR) of the cell based on a ratio of i) a first difference between first voltage and the second voltage and ii) a second difference between the first amperage and the second amperage.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-4 wherein like numbers are used to indicate like and corresponding parts.

Turning now to the drawings, FIG. 1 illustrates a block diagram depicting selected elements of an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, or a camera, or another type of peripheral device.

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In particular embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

The information handling system 100 can also include a battery management computing module 190. The battery management computing module 190 can be in communication with the processor subsystem 120, or be included by the processor subsystem 120. The battery management computing module 190 can be a battery management unit (BMU).

Figure 2:
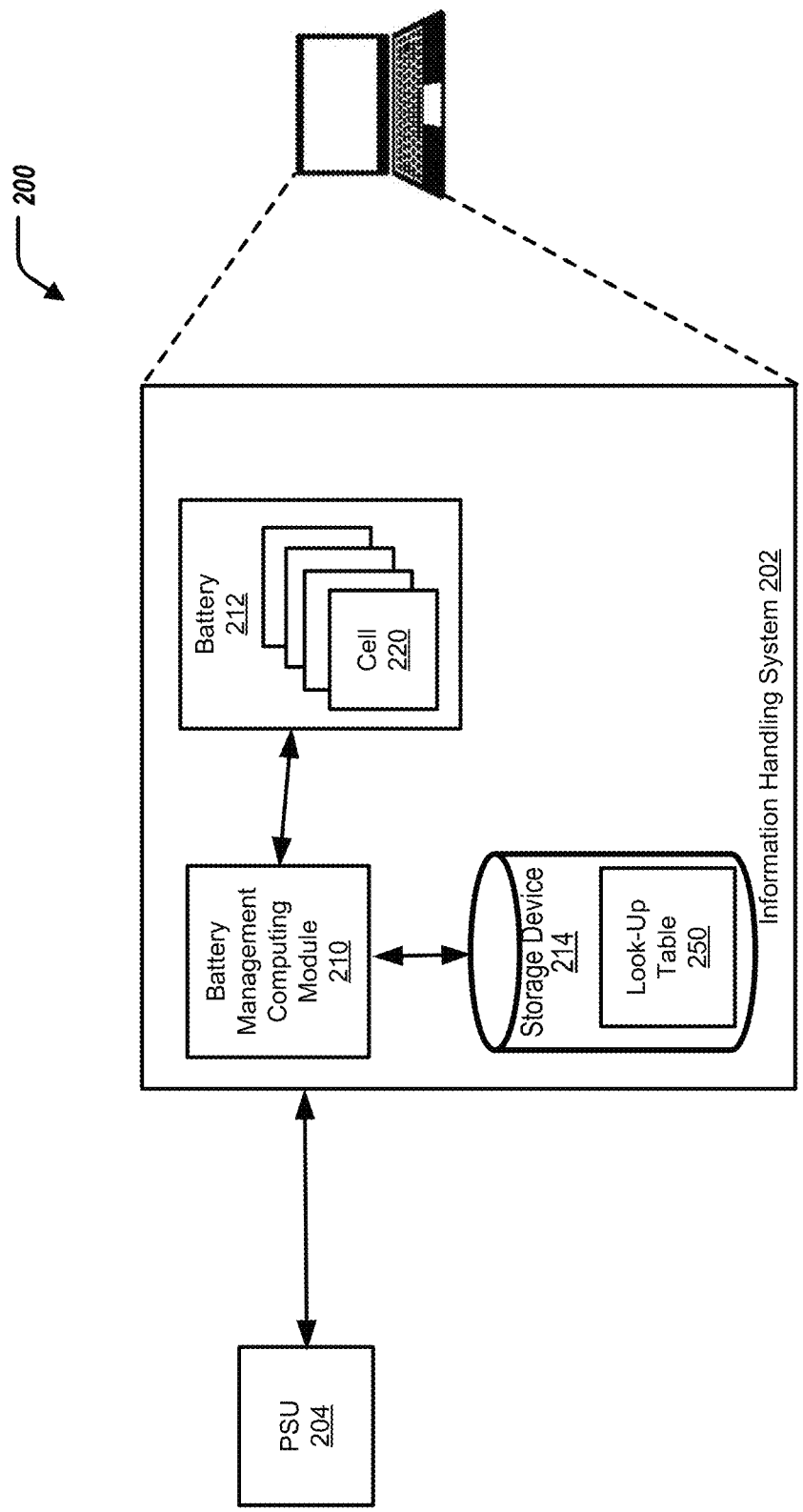
FIG. 2 illustrates a block diagram of an information handling system for battery status monitoring and battery management of the information handling system.

Turning to FIG. 2, FIG. 2 illustrates an environment 200 including an information handling system 202 and a power supply unit (PSU) 204. The information handling system 202 can include a battery management computing module 210, a battery 212, and a storage device 214. In some examples, the information handling system 202 is similar to, or includes, the information handling system 100 of FIG. 1. In some examples, the battery management computing module 210 is the same, or substantially the same, as the battery management computing module 190 of FIG. 1.

The battery 212 can include one or more cells 220. For example, the battery 212 can include four cells 220.

The battery management computing module 210 can be in communication with the battery 212 and the storage device 214. The PSU 204 can be in communication with the information handling system 202, and specifically, the battery management computing module 210 and/or the battery 212.

The PSU 204 can provide electrical energy to the information handling system 202, and in particular, charging of the battery 212.

In short, the battery management computing module 210 can perform direct current internal resistance (DCIR) measurements of the battery 212 for customization of a charge policy of the battery 212. Specifically, the DCIR of the battery 212 can be correlated with a performance of the battery 212. Thus, by developing a battery DCIR diagnosis method and management of the charge policy according to the DCIR can minimize unexpected performance issues of the battery 212.

Figure 3:
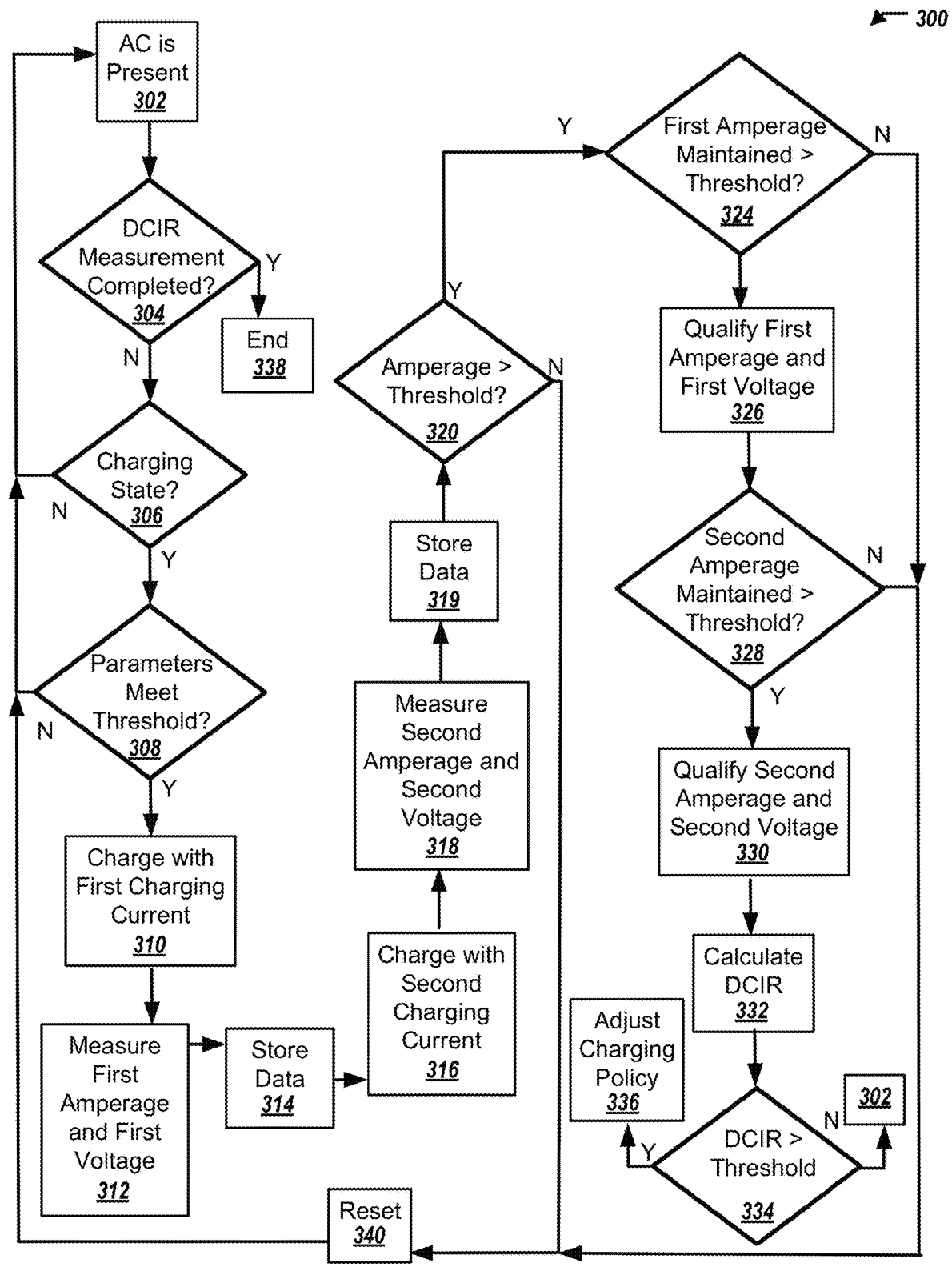
FIG. 3 illustrates a method for battery status monitoring and battery management of the information handling system.

FIG. 3 illustrates a flowchart depicting selected elements of an embodiment of a method 300 for battery status monitoring and battery management of the information handling system 202. The method 300 may be performed by the information handling system 100, the information handling system 202, and/or the battery management computing module 210, and with reference to FIGS. 1-2 and 4. It is noted that certain operations described in method 300 may be optional or may be rearranged in different embodiments.

Figure 4:
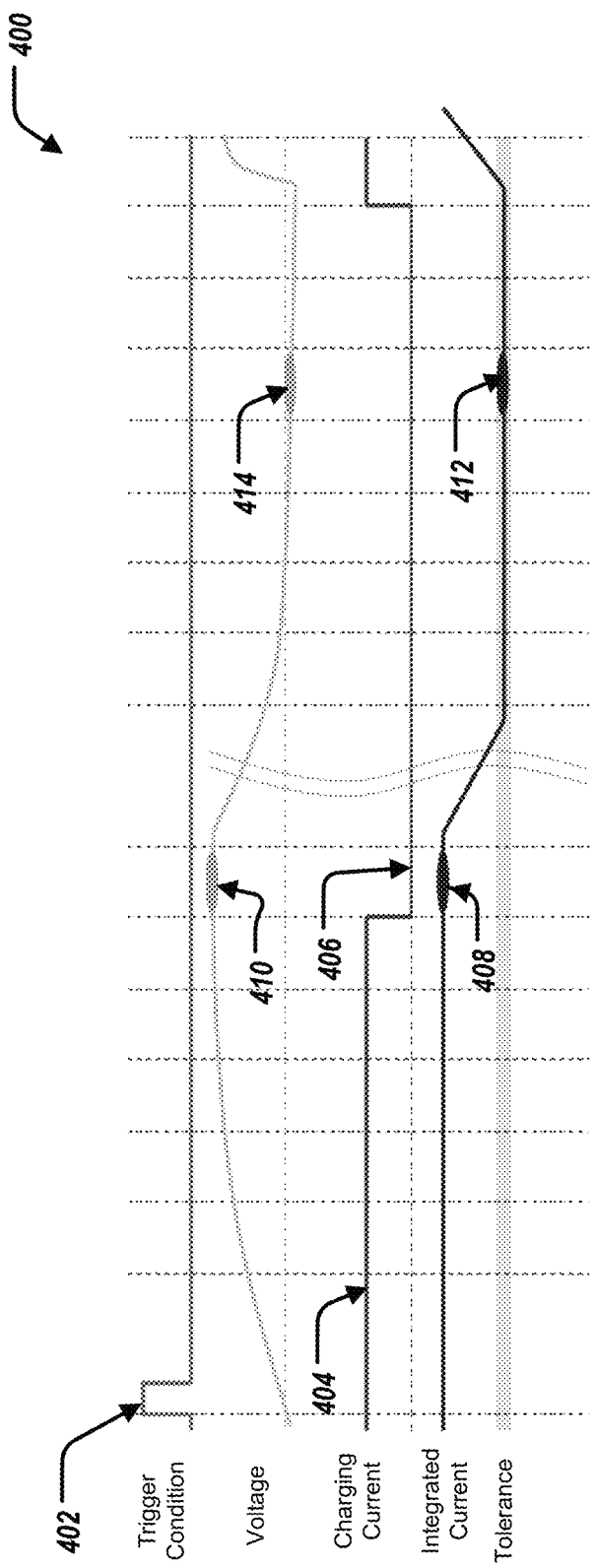
FIG. 4 illustrates a timing diagram for battery status monitoring and battery management of the information handling system

FIG. 4 illustrates a timing diagram 400 for battery status monitoring and battery management of the information handling system 202.

The battery management computing module 210 determines that the PSU 204 is coupled to the information handling system, and in particular, that the PUS PSU 204 is providing electrical energy to the battery 212, at 302. The battery management computing module 210 determines whether a direct current internal resistance (DCIR) measurement of the battery 212 has been performed in the current charging cycle of the battery 212, at 304. That is, duplication of the DCIR measurement of the battery 212 may not be necessary (within a same charging cycle).

When the battery management computing module 210 has not performed a DCIR measurement of the battery 212 for the current charging cycle (at 304), the battery management computing module 210 determines whether the battery 212 is in a charging state, at 306. That is, the battery management computing module 210 determines whether the PSU 204 is currently providing electrical energy to the battery 212 to charge the cell 220.

When the battery management computing module 210 determines that the battery 212 is in the charging state (at 306), the battery management computing module 210 determines whether trigger parameters are satisfied, at 308. In some examples, the trigger parameters are a threshold current, a temperature range of the battery 212, a threshold state of charge (SOC) of the battery 212, and a cell voltage range. In some examples, the battery management computing module 210 determines whether each of the trigger parameters are satisfied. In some examples, the threshold current trigger parameters can be greater than or equal to 4000 milliamperes. In some examples, the temperature range of the battery 212 is between 20 degrees Celsius and 35 degrees Celsius. In some examples, the threshold SOC of the battery 212 is greater than or equal to 50%. In some examples, the cell voltage range is between 4200 millivolts and 4250 millivolts.

When the battery management computing module 210 determines that the trigger parameters are satisfied (at 308) (as shown by 402 of timing diagram 400), the battery management computing module 210 facilitates charging, over a first time period, of the battery 212 with a first charging current, at 310. That is, the battery management computing module 210 can regulate the charging current provided by the PSU 204 such that the battery 212 receives the electrical energy from the PSU 204 at the first charging rate (as shown by 404 of timing diagram 400). The battery 212 can receive the electrical energy from the PSU 204 at the first charging rate from the first time period, e.g., approximately 1 to 3 seconds.

The battery management computing module 210 measures, in response to the first charging current and over the first time period, a first amperage and a first voltage of a cell 220 at predetermined intervals, at 312. That is, the battery management computing module 210 can measure the amperage and the voltage of each cell 220 during the first time period at predetermined intervals. For example, the battery management computing module 210 can measure the first amperage (as shown by 408 of the timing diagram 400) and the first voltage (as shown by 410 of the timing diagram 400) of the cell 220 during the first time period at predetermined intervals approximately 0.3-1 Hz. For example, the battery management computing module 210 can measure the first amperage and the first voltage of the cell 220 during the first time period at predetermined intervals every 125 milliseconds.

The battery management computing module 210 stores, at a look-up table (LUT) 250 of the storage device 214, data indicating the first amperage and the first voltage of the cell 220 (at each of the predetermined intervals), at 314.

The battery management computing module 210 facilitates charging, over a second time period after the first time period, of the battery 212 with a second charging current, at 316. That is, the battery management computing module 210 can regulate the charging current provided by the PSU 204 such that the battery 212 receives the electrical energy from the PSU 204 at the second charging rate (as shown by 406 of the timing diagram 400). In some examples, the second charging rate is less than the first charging rate. In some examples, the second charging rate is greater than the first charging rate. The battery 212 can receive the electrical energy from the PSU 204 at the second charging rate from the first time period, e.g., approximately 1 to 3 seconds.

In some examples, the second charging rate is referred to as a "suppressed" charging rate.

The battery management computing module 210 measures, in response to the second charging current and over the second time period, a second amperage and a second voltage of a cell 220 at predetermined intervals, at 318. That is, the battery management computing module 210 can measure the amperage and the voltage of each cell 220 during the second time period at predetermined intervals. For example, the battery management computing module 210 can measure the second amperage (as shown by 412 of the timing diagram 400) and the second voltage (as shown by 414 of the timing diagram 400) of the cell 220 during the second time period at predetermined intervals approximately 0.3-1 Hz. For example, the battery management computing module 210 can measure the second amperage and the second voltage of the cell 220 during the second time period at predetermined intervals every 125 milliseconds.

The battery management computing module 210 stores, at a look-up table (LUT) 250 of the storage device 214, data indicating the second amperage and the second voltage of the cell 220 (at each of the predetermined intervals), at 319.

The battery management computing module 210 accesses the stored data at the LUT 250, and based on the stored data, determines whether the first amperage associated with the cell 220 is equal to or greater than a first target threshold amperage, at 320. That is, the battery management computing module 210 determines whether the determines whether the first amperage associated with the cell 220 is equal to or greater than the first target threshold amperage prior to a timeout. That is, during the first time period, the battery management computing module 210 analyzes the stored data of the first amperage of the cell 220 over the predetermined intervals, and determines whether the first amperage of the cell 220 is greater (at any point) than the first target threshold amperage for one or more of the predetermined intervals.

In parallel, or concurrently, the battery management computing module 210, based on the stored data, determines whether the second amperage associated with the cell 220 is equal to or greater than a second target threshold amperage, at 320. That is, the battery management computing module 210 determines whether the second amperage associated with the cell 220 is equal to or greater than the second target threshold amperage prior to a timeout. That is, during the second time period, the battery management computing module 210 analyzes the stored data of the second amperage of the cell 220 over the predetermined intervals, and determines whether the second amperage of the cell 220 is greater (at any point) than the second target threshold amperage for one or more of the predetermined intervals.

In some examples, the battery management computing module 210 determines that the first amperage associated with the cell 220 is equal to or greater than the first target threshold amperage and the second amperage associated with the cell 220 is equal to or greater than the second target threshold amperage (at 320), and in response, determines, based on the stored data, whether the first amperage of the cell 220 was maintained greater than a first threshold amount of time within the first time period, at 324. Specifically, the battery management computing module 210 determines, based on the stored data, whether the first amperage of the cell 220 was maintained equal to or greater than the first target threshold amperage for greater than the first threshold amount of time within the first time period.

In some examples, the battery management computing module 210 determines, based on the stored data, that the first amperage of the cell 220 was maintained greater than the first threshold amount of time within the first time period (at 324), and in response, qualifies the first amperage and the first voltage as stable for the cell 220 for the first time period, at 326. Specifically, the battery management computing module 210 determines, based on the stored data, that the first amperage of the cell 220 was maintained equal to or greater than the first target threshold amperage for greater than the first threshold amount of time within the first time period, and in response, qualifies the first amperage and the first voltage as stable for the cell 220 for the first time period.

After qualifying the first amperage and the first voltage as stable for the cell 220 for the first time period, the battery management computing module 210, determines, based on the stored data, whether the second amperage of the cell 220 was maintained greater than a second threshold amount of time within the second time period, at 328. Specifically, the battery management computing module 210 determines, based on the stored data, whether the second amperage of the cell 220 was maintained equal to or greater than the second target threshold amperage for greater than the second threshold amount of time within the second time period.

In some examples, the battery management computing module 210 determines, based on the stored data, that the second amperage of the cell 220 was maintained greater than the second threshold amount of time within the second time period (at 328), and in response, qualifies the second amperage and the second voltage as stable for the cell 220 for the second time period, at 330. Specifically, the battery management computing module 210 determines, based on the stored data, that the second amperage of the cell 220 was maintained equal to or greater than the second target threshold amperage for greater than the second threshold amount of time within the second time period, and in response, qualifies the second amperage and the second voltage as stable for the cell 220 for the second time period.

The battery management computing module 210, in response to i) qualifying the first amperage and the first voltage for the cell 220 for the first time period and ii) qualifying the second amperage and the second voltage for the cell 220 for the second time period, calculates a direct circuit internal resistance (DCIR) of the cell 220, at 332. The battery management computing module 210 calculates the DCIR of the cell 220 based on the first voltage, the second voltage, the first amperage, and the second amperage. Specifically, the battery management computing module 210 calculates the DCIR of the cell 220 based on a ratio of i) a first difference between the first voltage and the second voltage and ii) a second difference between the first current and the second current. For example, the battery management computing module 210 calculates the DCIR of the cell 220 based on the equation:

$$DCIR = \frac{\text{First Voltage} - \text{Second Voltage}}{\text{First Amperage} - \text{Second Amperage}}. \quad [1]$$

The battery management computing module 210 can then compare the DCIR to a threshold, at 334. The battery management computing module 210 can determine whether the DCIR is greater than the threshold. When the battery management computing module 210 determines that the DCIR is greater than the threshold, the battery management computing module 210 adjusts a charge policy associated with the charging of the battery 212, at 336. Specifically, the storage device 214 can store data indicating the charge policy that indicates charging parameters of the battery 212 at the storage device 214. In some examples, adjusting the charge policy of the battery 212 can include the battery management computing module 210 adjusting a charge voltage associated with charging the battery 212. In some examples, adjusting the charge policy of the battery 212 can include the battery management computing module 210 reducing the charge voltage associated with charging the battery 212.

For example, the battery management computing module 210, in response to the DCIR of the cell 220 greater than a threshold, can change the charge voltage automatically, and in some examples, reduced multiple levels (e.g., if the DCIR continues increasing above the threshold). When the charge voltage is reduced, stress on the battery 212 can be reduced.

In some examples, the battery management computing module 210 can determine that the DCIR is less than the threshold, and in response, return to step 302.

In some examples, the battery management computing module 210 has performed a DCIR measure of the battery 212 for the current charging cycle (at 304), and in response, the process ends, at 338.

In some examples, the battery management computing module 210 determines that the first amperage associated with the cell 220 is less than the first target threshold amperage and/or the second amperage associated with the cell 220 is less than the second target threshold amperage (at 320), and in response, resets the charging current of the battery 212 to the first charging current and resets the LUT 250, at 340. For example, the battery management computing module 210 can regulate the charging current provided by the PSU 204 such that the battery 212 receives the electrical energy from the PSU 204 at the first charging rate. For example, the battery management computing module 210 can reset the LUT 250 to remove data indicating the voltage and amperage levels of the cell 220.

In some examples, the battery management computing module 210 determines, based on the stored data, that the first amperage of the cell 220 was not maintained greater than the first threshold amount of time within the first time period (at 324), and in response, resets the charging current of the battery 212 to the first charging current and resets the LUT 250, at 340.

In some examples, the battery management computing module 210 determines, based on the stored data, that the second amperage of the cell 220 was not maintained greater than the second threshold amount of time within the second time period (at 328), and in response, resets the charging current of the battery 212 to the first charging current and resets the LUT 250, at 340.

Steps 310-336 can be performed for each cell 220 of the battery 212, or any subset of the cells 220 of the battery 212.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A method of managing a battery at an information handling system, the method comprising:
    charging, over a first time period, the battery with a first charging current;
    charging, over a second time period after the first time period, the battery with a second charging current less than the first charging current;
    for each cell of the battery:
        measuring, in response to the first charging current and over the first time period, a first amperage and a first voltage of the cell at predetermined intervals;
        measuring, in response to the second charging current and over the second time period, a second amperage and a second voltage of the cell at the predetermined intervals;
        storing, at a look-up table (LUT) at a storage device, data indicating the first and the second amperages and the first and the second voltages of the cell at each of the predetermined intervals;
        determining, based on the stored data, that the first amperage of the cell was maintained greater than a first threshold amount of time within the first time period, and in response, qualifying the first amperage and the first voltage as stable for the first time period;
        determining, based on the stored data, that the second amperage of the cell was maintained greater than a second threshold amount of time within the second time period, and in response, qualifying the second amperage and the second voltage as stable for the second time period;
        in response to qualifying the first amperage and the first voltage for the first time period and qualifying the second amperage and the second voltage for the second time period, calculating a direct circuit internal resistance (DCIR) of the cell based on a ratio of i) a first difference between first voltage and the second voltage and ii) a second difference between the first amperage and the second amperage; and
        determining, based on the stored data, that the first amperage of the cell was not maintained greater than the first threshold amount of time within the first time period, and in response, resetting the charging current of the battery to the first charging current and resetting the look-up table.

2. The method of claim 1, further comprising:
    comparing the DCIR to a threshold;
    determining, based on comparing, that the DCIR is greater than the threshold; and
    in response to determining that the DCIR is greater than the threshold, adjusting a charge policy associated with charging of the battery.

3. The method of claim 2, wherein adjusting the charge policy associated with charging of the battery includes adjusting a charge voltage associated with charging of the battery.

4. The method of claim 3, wherein adjusting the charge voltage associated with charging of the battery includes reducing the charge voltage associated with charging of the battery.

5. The method of claim 1, further comprising:
    determining that, based on the stored data, that the second amperage of the cell was not maintained greater than the second threshold amount of time within the second time period, and in response, resetting the charging current of the battery to the first charging current and resetting the look-up table.

6. The method of claim 1, further comprising:
determining that one or more trigger parameters are satisfied, and in response, charging the battery with the first charging current.

7. The method of claim 1, further comprising:
determining, based on the stored data, that the first amperage of the cell is equal to or greater than a target threshold amperage, and in response, determining, based on the stored data, whether the first amperage of the cell was maintained equal to or greater than the target threshold amperage for greater than the first threshold amount of time within the first time period.

8. The method of claim 1, further comprising:
determining, based on the stored data, that the first amperage of the cell is less than a target threshold amperage, and in response, resetting the charging current of the battery to the first charging current and resetting the look-up table.

9. The method of claim 1, further comprising:
determining, based on the stored data, that the second amperage of the cell is equal to or greater than a target threshold amperage, and in response, determining, based on the stored data, whether the second amperage of the cell was maintained equal to or greater than the target threshold amperage for greater than the second threshold amount of time within the second time period.

10. An information handling system comprising a processor having access to memory media storing instructions executable by the processor to perform operations, comprising:
charging, over a first time period, the battery with a first charging current;
charging, over a second time period after the first time period, the battery with a second charging current less than the first charging current;
for each cell of the battery:
measuring, in response to the first charging current and over the first time period, a first amperage and a first voltage of the cell at predetermined intervals;
measuring, in response to the second charging current and over the second time period, a second amperage and a second voltage of the cell at the predetermined intervals;
storing, at a look-up table (LUT) at a storage device, data indicating the first and the second amperages and the first and the second voltages of the cell at each of the predetermined intervals;
determining, based on the stored data, that the first amperage of the cell was maintained greater than a first threshold amount of time within the first time period, and in response, qualifying the first amperage and the first voltage as stable for the first time period;
determining, based on the stored data, that the second amperage of the cell was maintained greater than a second threshold amount of time within the second time period, and in response, qualifying the second amperage and the second voltage as stable for the second time period;
in response to qualifying the first amperage and the first voltage for the first time period and qualifying the second amperage and the second voltage for the second time period, calculating a direct circuit internal resistance (DCIR) of the cell based on a ratio of i) a first difference between first voltage and the second voltage and ii) a second difference between the first amperage and the second amperage; and
determining, based on the stored data, that the first amperage of the cell was not maintained greater than the first threshold amount of time within the first time period, and in response, resetting the charging current of the battery to the first charging current and resetting the look-up table.

11. The information handling system of claim 10, the operations further comprising:
comparing the DCIR to a threshold;
determining, based on comparing, that the DCIR is greater than the threshold; and
in response to determining that the DCIR is greater than the threshold, adjusting a charge policy associated with charging of the battery.

12. The information handling system of claim 11, wherein adjusting the charge policy associated with charging of the battery includes adjusting a charge voltage associated with charging of the battery.

13. The information handling system of claim 12, wherein adjusting the charge voltage associated with charging of the battery includes reducing the charge voltage associated with charging of the battery.

14. The information handling system of claim 10, the operations further comprising:
determining that, based on the stored data, that the second amperage of the cell was not maintained greater than the second threshold amount of time within the second time period, and in response, resetting the charging current of the battery to the first charging current and resetting the look-up table.

15. The information handling system of claim 10, the operations further comprising:
determining that one or more trigger parameters are satisfied, and in response, charging the battery with the first charging current.

16. The information handling system of claim 10, the operations further comprising:
determining, based on the stored data, that the first amperage of the cell is equal to or greater than a target threshold amperage, and in response, determining, based on the stored data, whether the first amperage of the cell was maintained equal to or greater than the target threshold amperage for greater than the first threshold amount of time within the first time period.

17. A non-transitory computer-readable medium storing software comprising instructions executable by one or more computers which, upon such execution, cause the one or more computers to perform operations comprising:
charging, over a first time period, the battery with a first charging current;
charging, over a second time period after the first time period, the battery with a second charging current less than the first charging current;
for each cell of the battery:
measuring, in response to the first charging current and over the first time period, a first amperage and a first voltage of the cell at predetermined intervals;
measuring, in response to the second charging current and over the second time period, a second amperage and a second voltage of the cell at the predetermined intervals;
storing, at a look-up table (LUT) at a storage device, data indicating the first and the second amperages and the first and the second voltages of the cell at each of the predetermined intervals;
determining, based on the stored data, that the first amperage of the cell was maintained greater than a first threshold amount of time within the first time period, and in response, qualifying the first amperage and the first voltage as stable for the first time period;

determining, based on the stored data, that the second amperage of the cell was maintained greater than a second threshold amount of time within the second time period, and in response, qualifying the second amperage and the second voltage as stable for the second time period;

in response to qualifying the first amperage and the first voltage for the first time period and qualifying the second amperage and the second voltage for the second time period, calculating a direct circuit internal resistance (DCIR) of the cell based on a ratio of i) a first difference between first voltage and the second voltage and ii) a second difference between the first amperage and the second amperage; and determining, based on the stored data, that the first amperage of the cell was not maintained greater than the first threshold amount of time within the first time period, and in response, resetting the charging current of the battery to the first charging current and resetting the look-up table.

\* \* \* \* \*